(12) United States Patent
Kim et al.

(10) Patent No.: US 8,569,939 B2
(45) Date of Patent: Oct. 29, 2013

(54) LUMINOUS DEVICE WITH HEAT PIPE AND METHOD OF MANUFACTURING HEAT PIPE LEAD FOR LUMINOUS DEVICE

(75) Inventors: Do-Hyung Kim, Suwon (KR);
Moon-Whan Shin, Seoul (KR);
Woong-Joon Hwang, Seoul (KR);
Chung-Hoon Lee, Gyeonggi-Do (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 561 days.

(21) Appl. No.: 11/575,292

(22) PCT Filed: Aug. 26, 2005

(86) PCT No.: PCT/KR2005/002839
§ 371 (c)(1),
(2), (4) Date: Mar. 14, 2007

(87) PCT Pub. No.: WO2006/031023
PCT Pub. Date: Mar. 23, 2006

(65) Prior Publication Data
US 2008/0093962 A1    Apr. 24, 2008

(30) Foreign Application Priority Data

Sep. 15, 2004  (KR) ............................. 2004-0073730
Sep. 22, 2004  (KR) ............................. 2004-0076058

(51) Int. Cl.
*H01J 1/02*     (2006.01)
*H01J 7/24*     (2006.01)
*H01J 61/52*    (2006.01)
*H01K 1/58*     (2006.01)

(52) U.S. Cl.
USPC ................................. 313/12; 313/11; 313/46

(58) Field of Classification Search
USPC .......................... 313/11–13, 46; 165/180–183
See application file for complete search history.

(56) References Cited

U.S. PATENT DOCUMENTS 5,803,566 A  *  9/1998  Ogino ............................. 353/60

FOREIGN PATENT DOCUMENTS

| JP | 59-62467 | 4/1984 |
| JP | 5-114480 | 5/1993 |
| JP | 06-163995 | 6/1994 |

(Continued)

OTHER PUBLICATIONS

Included WO 2004/038759 A2 to Dahm.*

*Primary Examiner* — Anh T. Mai
*Assistant Examiner* — Zachary J Snyder
(74) *Attorney, Agent, or Firm* — H.C. Park & Associates, PLC

(57) ABSTRACT

The present invention relates to a luminous device with a heat pipe formed therein and a heat pipe lead for a luminous device. The present invention provides a luminous device including a heat pipe lead or electrode and a luminous chip mounted onto the heat pipe lead or electrode. The luminous device of the present invention further comprises a heat dissipation member, such as a heat radiating plate or thermoelectric device, installed at an end of the heat pipe lead or electrode. Therefore, through the heat pipe lead or electrode of the present invention, a higher heat dissipation effect greater can be obtained as compared with the conventional one. As a result, it is possible to reduce thermal stress on a luminous device and to prevent the occurrence of a phenomenon in which external impurities penetrate into the luminous device. In addition, the cooling efficiency and the light-emitting efficiency of a luminous chip can be maximized by further disposing a heat dissipation member outside the heat pipe.

15 Claims, 12 Drawing Sheets

(56) References Cited

FOREIGN PATENT DOCUMENTS

| JP | 2000-183405 | 6/2000 |
| JP | 3079241 | 5/2001 |
| JP | 2001-185763 | 7/2001 |
| JP | 2002-84029 | 3/2002 |
| JP | 2003-264390 | 9/2003 |
| JP | 2004-006603 | 1/2004 |
| JP | 2004-241401 | 8/2004 |
| JP | 2005-85490 | 3/2005 |
| WO | WO 99/16136 | 4/1999 |
| WO | WO 03/107440 | 12/2003 |
| WO | 2004/011848 | 2/2004 |

* cited by examiner

LUMINOUS DEVICE WITH HEAT PIPE AND METHOD OF MANUFACTURING HEAT PIPE LEAD FOR LUMINOUS DEVICE

TECHNICAL FIELD

The present invention relates to a luminous device, and more particularly, to a luminous device capable of greatly improving its own cooling performance by dissipating heat emitted from a luminous chip using a heat pipe electrode.

BACKGROUND ART

As shown in FIG. 1, a conventional lamp-type luminous device includes a luminous chip 1 that emits light when a voltage is applied thereto, and first and second leads 2 and 3 that are connected to cathode and anode of the luminous chip 1, respectively, and made of a conductive metal material to apply a voltage to the luminous chip 1. The luminous chip 1 is attached to a cup-shaped pad formed on an end of the first lead 2 with a conductive adhesive and bonded to the second lead 3 via a wire 4. Further, the luminous chip 1 is molded with a molded portion 5 made of an insulating material such that it can be protected from the outside. At this time, the first and second leads 2 and 3 are partially exposed to the outside such that they can apply a voltage to the luminous chip from the outside.

The luminous device so configured has been recently implemented into a white LED applicable to a variety of fields as well as a monochromatic luminous device including the three primary colors, i.e. red (R), green (G) and blue (B). Therefore, the application field of a luminous device gradually tends to expand into a next-generation illumination system capable of substituting for an incandescent bulb, fluorescent lamp or street lamp as well as a luminous source for use in a backlight of a general display unit. Accordingly, there are advantages in that the illumination system using a luminous device does not need an inverter circuit and a core stabilizer, has a simpler lighting circuit than a general fluorescent lamp, and has low maintenance costs since it has lower power consumption and life at least ten times greater than that of the fluorescent lamp.

The luminous device so configured has been recently implemented into a white LED applicable to a variety of fields as well as a monochromatic luminous device including the three primary colors, i.e. red (R), green (G) and blue (B). Therefore, the application filed of a luminous device gradually tends to expand into a next-generation illumination system capable of substituting for an incandescent bulb, fluorescent lamp or street lamp as well as a luminous source for use in a backlight of a general display unit. Accordingly, there are advantages in that the illumination system using a luminous device does not need an inverter circuit and a core stabilizer, has a simpler lighting circuit than a general fluorescent lamp, and has low maintenance costs since it has lower power consumption and life at least ten times greater than that of the fluorescent lamp.

Recently, a study on such a luminous device for use in an illumination system has been vigorously conducted. However, since maximum luminous efficiency of a luminous device and heat dissipation characteristics correlate with each other, the heat dissipation problem should be solved if the luminous device is to be used for the illumination system. That is, if the luminous device is used for the illumination system, heat generated in the chip is increased and the chip in the luminous device is thus subjected to greater thermal stress. Accordingly, the product reliability is decreased and the life span of the product is also shortened. In particular, the lamp-type luminous device shown in FIG. 1 dissipates heat only via heat conduction of the metallic lead frames. There is a problem in that the thermal stress imposed on the luminous device is increased.

To solve such a problem, a heat dissipation member such as heat sink or slug made of a metal material with excellent heat conductivity is mounted between the luminous chip and a substrate such that the thermal stress imposed on the luminous device has been successfully reduced to a certain degree.

However, due to limitation in the conductivity of metal and poor heat transfer characteristics at interfaces between the heat dissipation member and the substrate or luminous chip, the resultant heat conductivity is lowered. Thus, the thermal stress problem of the luminous device cannot be effectively solved. Further, there is another problem in that the electrical characteristics of the luminous device are deteriorated or luminous characteristics of the luminous device are changed since external foreign substances such as moisture penetrate into the luminous device through a pre-determined gap that may occur between the heat dissipation member and the substrate. Therefore, further increased luminous efficiency cannot be obtained by only such heat conduction of the heat dissipation member, and the increase in cooling load cannot also effectively solved.

DISCLOSURE OF INVENTION

Technical Problem

Accordingly, the present invention is conceived to solve the aforementioned problems. An object of the present invention is to provide a luminous device capable of effectively decreasing thermal stress and applying an electrical current to a luminous chip by dissipating heat generated from the luminous chip as fast as possible.

Further, another object of the present invention is to provide a heat pipe lead frame for a luminous device and a method of manufacturing the heat pipe lead frame.

Technical Solution

According to an aspect of the present invention, there is provided a luminous device comprising a lead, a heat pipe lead positioned to be spaced apart from the lead by a predetermined interval, a luminous chip mounted onto the heat pipe lead, a wire for connecting the luminous chip and the lead with each other, and a molding portion for sealing the lead, the heat pipe lead and the luminous chip.

Preferably, the heat pipe lead includes at least one internal space, a wick formed on an inner wall defining the internal space, and a fluid located within the internal space. At this time, the fluid is selected from a group consisting of methanol, acetone, distilled water, mercury, He, $N_2$, $CHClF_2$, $NH_3$, $CCl_2F_2$, $CClF_2$, $CClF_2$, $CCl_3F$ and $CCl_2F$-$CClF_2$, and 10% to 70% of the internal space is filled with the fluid. Preferably, a separating plate is further installed in the internal space.

Preferably, a hole cup for mounting the luminous chip therein is formed at an upper portion of the heat pipe lead.

Furthermore, the heat pipe lead may include at least two external lead portions protruding outward from the molding portion and a central lead portion for connecting the external lead portions. Preferably, a hole cup for mounting the luminous chip therein is formed on the central lead portion.

In addition, the luminous device may further comprise a heat dissipation member connected to the heat pipe lead.

According to another aspect of the present invention, there is provided a luminous device, comprising a substrate, a heat pipe electrode formed on the substrate, an electrode formed to be spaced apart from the heat pipe electrode by a predetermined interval, a luminous chip mounted on the heat pipe electrode, a wire for connecting the luminous chip and the electrode with each other, and a molding portion for sealing the luminous chip.

Preferably, the heat pipe electrode includes at least one internal space, a wick formed on an inner wall defining the internal space, and a fluid located within the internal space. More preferably, the fluid is selected from a group consisting of methanol, acetone, distilled water, mercury, He, $N_2$, $CHClF_2$, $NH_3$, $CCl_2F_2$, $CClF_2$-$CClF_2$, $CCl_3F$ and $CCl_2F$-$CClF_2$, and 10% to 70% of the internal space is filled with the fluid. In addition, a separating plate may be further installed in the internal space.

Preferably, the heat pipe electrode is formed either on an upper region of the substrate or upper and side regions of the substrate. Of course, the heat pipe electrode may be formed to perforate through the substrate.

In addition, the luminous device may further comprise a heat dissipation member connected to the heat pipe electrode.

According to a further aspect of the present invention, there is provided a method of manufacturing a heat pipe lead for a luminous device, comprising the steps of (a) preparing a predetermined support plate including a first lead formed with an opening at a side or lower portion thereof and a second lead corresponding to the first lead, and (b) injecting a fluid into an internal space of the first lead, wherein the opening communicates with the internal space.

Here, the step (b) comprises the steps of making the internal space in a vacuum state by removing air from the internal space through the opening, injecting the fluid into the internal space through the opening, and sealing the opening.

In addition, the method of the present invention may further comprise the step of forming a wick on an inner wall defining the internal space, prior to the step (b).

BEST MODE FOR CARRYING OUT THE INVENTION

Figure 1:
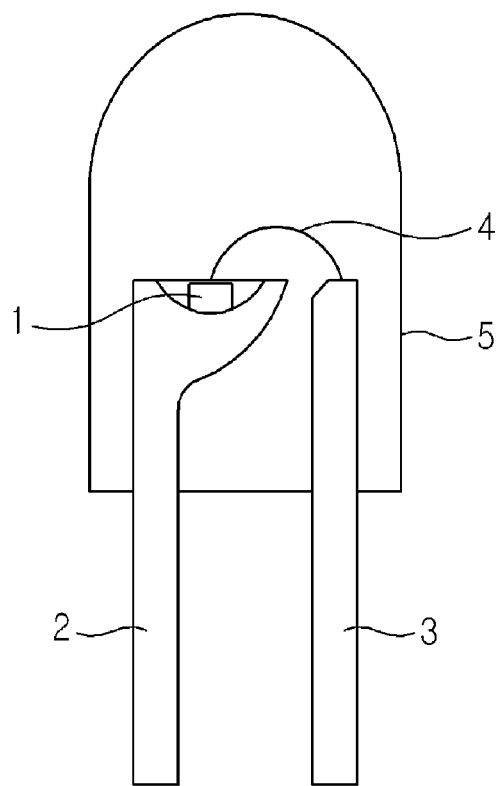
FIG. 1 is a sectional view of a luminous device according to the prior art.

Hereinafter, preferred embodiments of the present invention will be described in detail with reference to the accompanying drawings. However, the present invention is not limited to the embodiments described below but will be implemented into a variety of different forms. The preferred embodiments of the present invention are merely provided to complete the description of the present invention and to fully explain the scope of the present invention to those skilled in the art. Like reference numerals designate like elements in the accompanying drawings.

Figure 2:
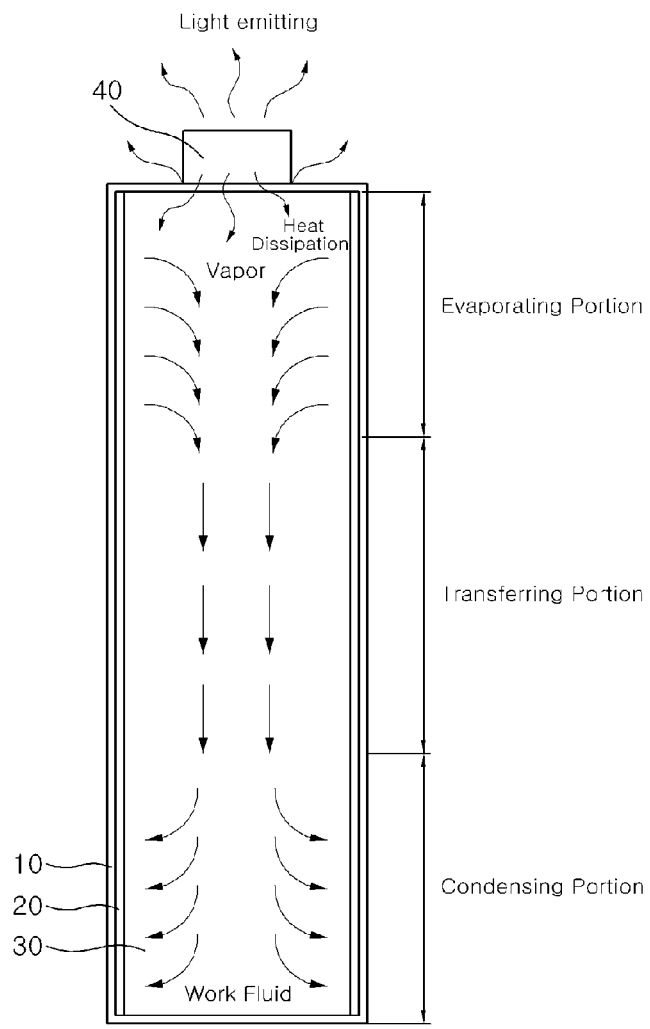
FIG. 2 is a schematic sectional view illustrating a heat dissipation principle of a heat pipe and a luminous device including the heat pipe.

FIG. 2 is a conceptual diagram illustrating the heat dissipation principle of a heat pipe and a luminous device including the heat pipe.

Referring to FIG. 2, a heat pipe lead frame 10 of the present invention is shaped as a sealed pipe in which a fluid 30 is injected into an internal space of the pipe. As shown in the figure, an evaporating portion is positioned just below a region in the heat pipe lead frame 10 to which a luminous chip 40 is mounted. Thus, a heat source, i.e. the luminous chip 40, is cooled while the fluid 30 is evaporated (vaporized) in the evaporating portion by means of the luminous chip 40. Then, the evaporated vapor is moved toward an opposite space in the heat pipe lead frame 10 via a transferring portion to dissipate heat in a condensing portion. The vapor is liquefied and then returned to the evaporating portion along the wall surfaces. Further, a wick 20 may be installed onto an inner wall of the heat pipe lead frame 10 in order to allow the fluid 30 to be more easily returned to the evaporating portion by means of a capillary pressure difference produced at a gas-liquid interface.

Thereafter, the operation that the fluid 30 receives heat from a heat source such as a luminous chip and then evaporates is repeated. In this way, a heat pipe can effectively transfer heat without any external power using latent heat of evaporation from the fluid 30 even though there is a small temperature difference in the heat pipe. That is, the heat can be transferred by means of latent heat of evaporation and condensation due to the temperature difference in the liquid.

As shown in FIG. 2, the heat pipe lead frame 10 may be filled with liquid or contain a porous material and liquid. The fluid 30 is a significant factor for determining the performance of a heat pipe heat exchanger and a study on improving the fluid characteristics has now been vigorously conducted. Heretofore, water is mainly used as a fluid of the heat pipe.

Since water has a characteristic that its surface tension is decreased as its temperature is increased, there is a limitation in that the heat exchange efficiency can be increased. A method of using alcohol or ammonia and nanofluid with a nanowire added thereto instead of such water is now tested. That is, any one of materials selected from a group consisting of methanol, acetone, distilled water, mercury, He, $N_2$, $CHClF_2$, $NH_3$, $CCl_2F_2$, $CClF_2$-$CClF_2$, $CCl_3F$ and $CCl_2F$-$CClF_2$ is used as the fluid. Further, a pipe of the aforementioned heat pipe lead frame 10 is made of a metal such as Cu, Al or steel with excellent electrical and heat conductivity.

Hereinafter, a luminous device integrally formed with a heat pipe so configured to have the aforementioned operating principle will be described. The heat pipe lead frame integrally formed with the aforementioned heat pipe is widely divided into a pipe type, a flat type, a loop type and the like according to the type of the luminous device applied thereto, and contains a certain fluid therein.

Figure 3:
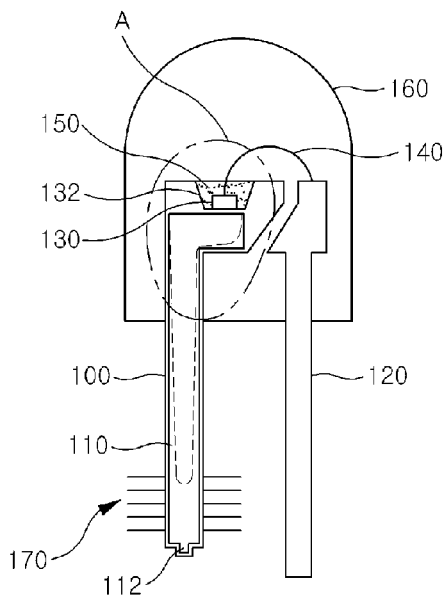
FIG. 3 is a sectional view of the luminous device according to a first embodiment of the present invention.

FIG. 3 is a sectional view of the luminous device according to a first embodiment of the present invention.

Referring to FIG. 3, the luminous device of this embodiment includes a heat pipe lead frame 100 integrally formed with a heat pipe, a lead frame 120 spaced apart from the heat pipe lead frame 100 by a certain interval, a luminous chip 130 mounted onto the heat pipe lead frame 100, and a wire 140 for connecting the luminous chip 130 and the lead frame 120 with each other.

The heat pipe lead frame 100 is manufactured by first injecting a certain fluid 110 into a hollow tube and then sealing the hollow tube filled with the fluid. For the injection and sealing of the fluid, a predetermined injection port 112 is further provided, as shown in FIG. 3. The heat pipe lead frame 100 is made of a material, including aluminum (Al) or copper (Cu), with excellent electrical and heat conductivity, and a variety of liquids with a low boiling point, such as methanol, acetone, distilled water and mercury, are used as the fluid 110 injected into the heat pipe lead frame 100. Further, the lead frame 120 is also made of a material with excellent electrical conductivity such as Al and Cu.

Therefore, heat emitted from the luminous chip 130 mounted to an upper end of the heat pipe lead frame 100 together with the light emission thereof is absorbed as evaporation heat when the fluid 110 is evaporated near an upper region of the internal space in the heat pipe lead frame 100, and it is then dissipated to the outside when the evaporated vapor is condensed in the internal space where the fluid 110 is positioned in a lower region in the heat pipe lead frame 100.

At this time, the heat pipe lead frame 100 may further include a wick (not shown) for transferring the fluid 110 positioned at the lower region to the upper region using a capillary phenomenon in order to further improve the cooling effect thereof. In this embodiment, a certain wick capable of producing the capillary phenomenon by using porous fibers and the like is formed on a side wall in the heat pipe lead frame 100 before the fluid 110 is injected into the heat pipe lead frame. Further, an interval between the luminous chip 130 mounted to the upper end of the heat pipe lead frame 100 and the internal space located below the luminous chip can be minimized to further increase the heat absorption effect. Thus, the heat pipe lead frame 100 functions as an electrode for supplying a certain electrical current to the luminous device and is used as a cooling means (i.e., heat pipe) for cooling heat generated from the luminous device.

As shown in FIG. 3, a hole cup 132 for mounting the luminous chip 130 therein is formed in the upper end of the heat pipe lead frame 100, and the luminous chip 130 is then mounted into the hole cup 132. The luminous chip 130 and upper portions of the heat pipe lead frame 100 and the lead frame 120 are sealed with a certain molding portion 160, after a phosphor 150 is potted on the luminous chip 130 in the hole cup 132. An additional heat dissipation member 170 is further provided at a lower portion of the heat pipe lead frame 100. The heat dissipation member 170 has an enlarged convective cooling area positioned at the lower region of the heat pipe lead frame 100 and thus serves to effectively dissipate heat emitted when the evaporated fluid is again converted into liquid. Such a heat dissipation member 170 includes a heat radiating plate or thermoelectric device. The aforementioned luminous chip 130 is electrically connected to the heat pipe lead frame 100.

Figure 4:
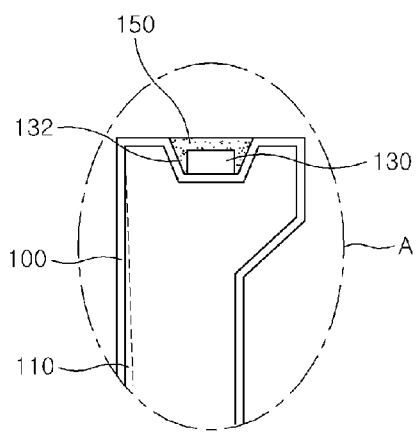
FIGS. 4 and 5 are enlarged sectional views of modified examples of an A region of FIG. 3.
Figure 5:
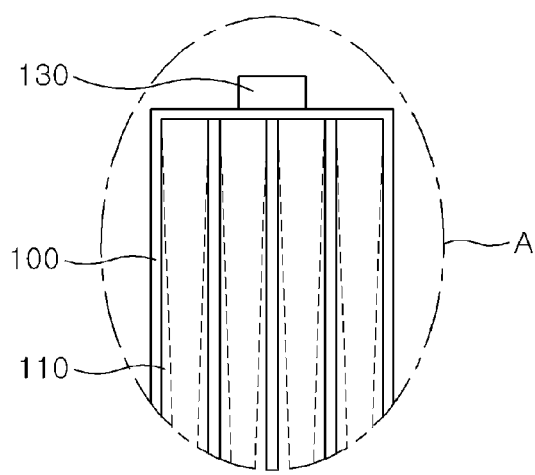

This embodiment is not limited to the above description and can be implemented in various ways. That is, an area where the luminous chip 130 is mounted can be expanded to further increase an area where heat emitted from the luminous chip 130 can be absorbed. That is, as illustrated in a modified example in FIG. 4, the internal space of the heat pipe lead frame 100 can be formed up to a region near the hole cup to surround the luminous chip 130 such that the heat dissipation effect of the heat pipe lead frame can be maximized. In addition, as illustrated in another modified example in FIG. 5, one or more spaces, i.e. a plurality of heat pipes, can be formed in the heat pipe lead frame 100 to cool the heat emitted from the luminous chip.

Figure 6:
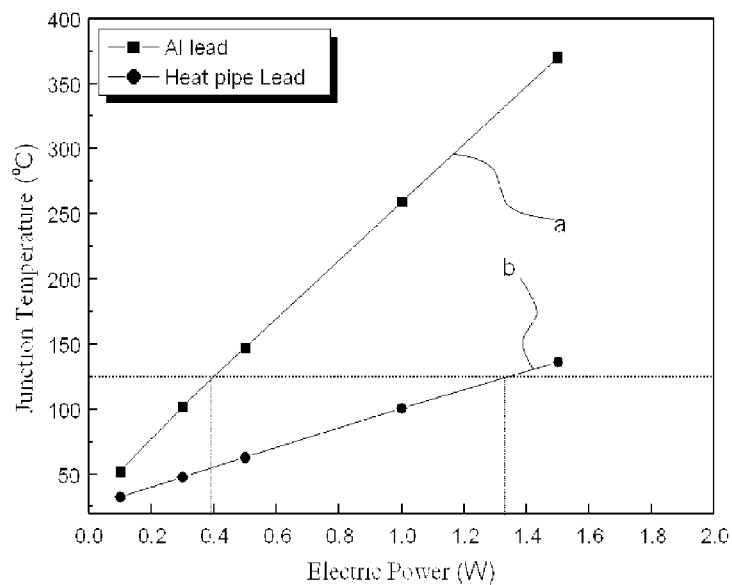
FIG. 6 is a graph showing a simulation result for the junction temperature of the luminous device according to the first embodiment of the present invention.
Figure 7:
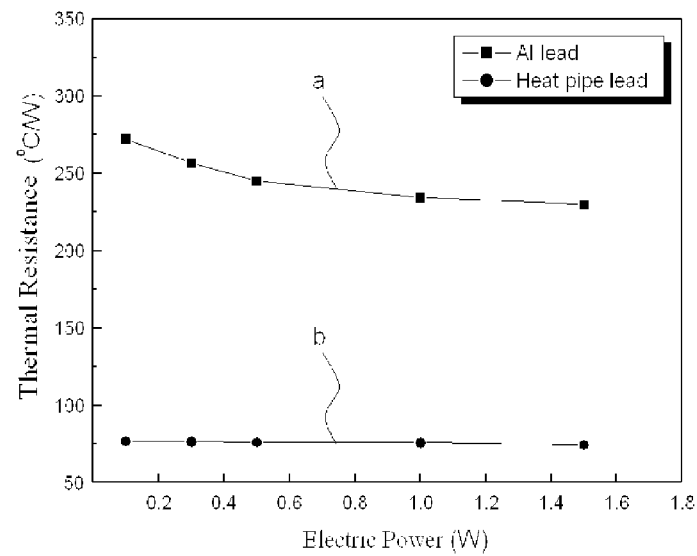
FIG. 7 is a graph showing a simulation result for the thermal resistance of the luminous device according to the first embodiment of the present invention.

FIG. 6 is a graph showing a simulation result for the junction temperature of the luminous device according to the first embodiment of the present invention, and FIG. 7 is a graph showing a simulation result for the thermal resistance of the luminous device according to the first embodiment of the present invention.

In FIGS. 6 and 7, lines 'a' designate junction temperature and thermal resistance of the luminous device with an aluminum lead frame, respectively. Further, lines 'b' designate the junction temperature and thermal resistance of the luminous device with heat pipe lead frame, respectively.

As illustrated in the graph of FIG. 6, it can be seen that the junction temperature of the conventional aluminum lead frame is rapidly increased but the junction temperature of the present heat pipe lead frame is slowly increased according to the electric power applied thereto. The heat pipe lead frame of this embodiment can be used without any thermal load at a level of electric power about three times greater than that of the conventional aluminum lead frame. That is, as shown in FIG. 6, the junction temperature of the conventional aluminum lead frame becomes about 125° C. when an electric power of 0.4 W is applied thereto, but the junction temperature of the present heat pipe lead frame becomes about 125° C. when an electric power of 1.3 W is applied thereto. It can be seen from the graph that the electric power applicable to the heat pipe lead frame is at least three times greater than that applicable to the aluminum lead frame when the heat is generated at the same temperature. On the other hand, the thermal resistance of the heat pipe lead frame according to this embodiment is about three times lower than that of the aluminum lead frame. As shown in FIG. 7, the thermal resistance of the conventional aluminum lead frame is about 250° C./W while the thermal resistance of the heat pipe lead frame according to this embodiment is about 75° C./W. Thus, the former is about three times higher than the latter.

In this way, the luminous device with the heat pipe lead frame integrally formed with a heat pipe can be driven with lower thermal resistance at a higher level of electric power.

Therefore, it can be seen that the thermal resistance of the heat pipe lead frame is constant as compared with the conventional lead frame as the electric power applied thereto is increased.

Such a heat pipe can be employed to a variety of LEDs in addition to the aforementioned luminous device.

Hereinafter, a high flux luminous device having a lead terminal integrally formed with a heat pipe according to a second embodiment of the present invention will be described with reference to the accompanying drawings. The description of the second embodiment that overlaps with that of the first embodiment will be omitted herein.

Figure 8:
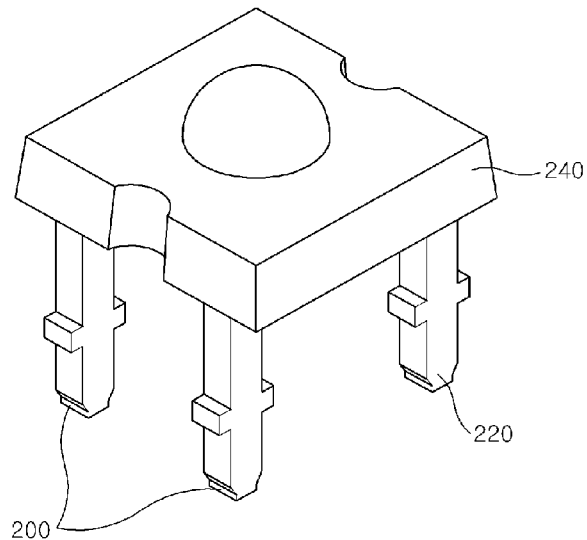
FIG. 8 is a perspective view of a luminous device according to a second embodiment of the present invention.
Figure 9:
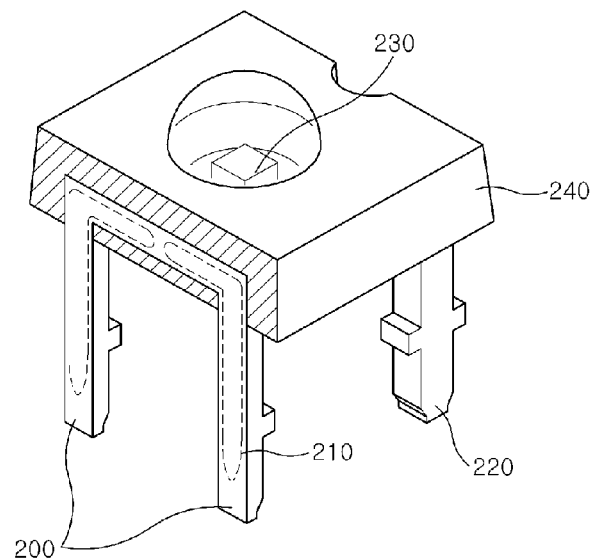
FIG. 9 is a sectional perspective view of the luminous device according to the second embodiment of the present invention.

FIG. 8 is a perspective view of a luminous device according to the second embodiment of the present invention, and FIG. 9 is a sectional perspective view of the luminous device according to the second embodiment of the present invention.

Referring to FIGS. 8 and 9, the luminous device of the present invention comprises a lead terminal 220 for applying predetermined power to the luminous device, a heat pipe lead terminal 200 integrally formed with a heat pipe, a luminous chip 230 mounted onto the heat pipe lead terminal 200, and a molding portion 240 for sealing upper portions of the lead terminal 220 and the heat pipe lead terminal 200 mounted with the luminous chip 230. The luminous chip 230 is electrically connected to the heat pipe lead terminal 200, and the luminous chip 230 and the lead terminal 220 are electrically connected to each other through a wire (not shown).

The lead terminal 220 includes two external lead portions protruding outward from the molding portion 240, and a central lead portion connecting the two external lead portions. Similarly, the heat pipe lead terminal 200 also includes two external lead portions protruding outward from the molding portion and a central lead portion connecting the two external portions. The two external lead portions and the central lead portion are integrally formed into a hollow tube which is sealed after a pre-determined fluid is injected into the hollow tube. A heat dissipation member such as a heat radiating fin, a heat radiating plate or a thermoelectric device may be formed on a portion of the external lead portions of the heat pipe lead terminal 200.

Therefore, the heat pipe lead terminal 200 functions as an electrode for supplying the luminous device with a predetermined electric current and a cooling means (heat pipe) for cooling heat generated from the luminous device.

Preferably, the aforementioned lead terminal 220 and heat pipe lead terminal 200 are formed of a material with excellent electrical and heat conductivity. The external leads of the lead terminal 220 and heat pipe lead terminal 200 are formed with horizontal projections such that they can be easily inserted into and mounted to external circuits. Further, the molding portion 240 is formed into a rectangular pillar, and preferably, a convex lens is formed on a region over the luminous chip 230.

Figure 10:
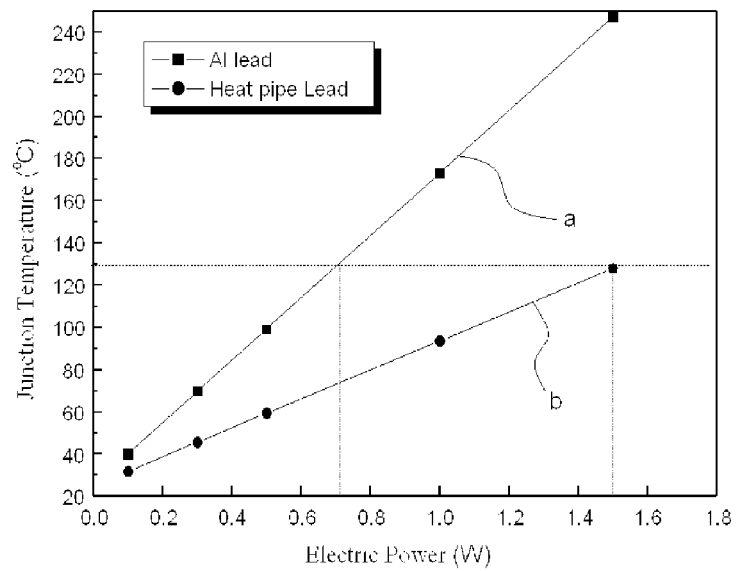
FIG. 10 is a graph showing a simulation result for the junction temperature of the luminous device according to the second embodiment of the present invention.
Figure 11:
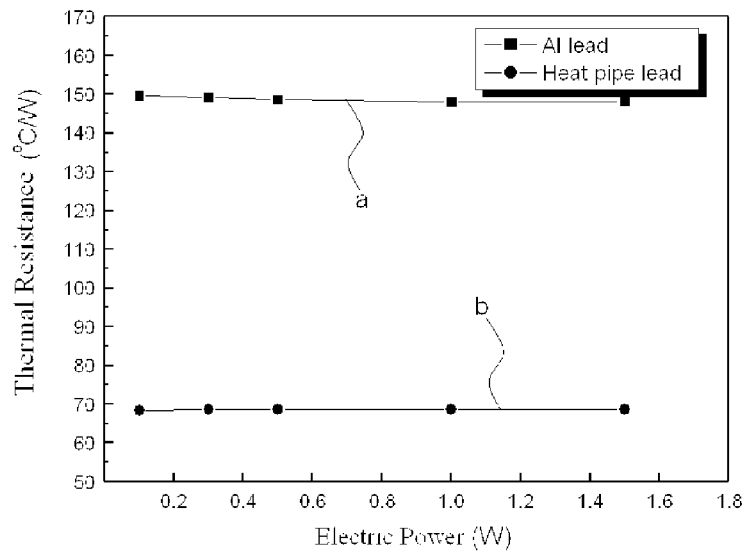
FIG. 11 is a graph showing a simulation result for the thermal resistance of the luminous device according to the second embodiment of the present invention.

FIG. 10 is a graph showing a simulation result for the junction temperature of the luminous device according to the second embodiment of the present invention, and FIG. 11 is a graph showing a simulation result for the thermal resistance of the luminous device according to the second embodiment of the present invention.

In FIGS. 10 and 11, lines 'a' designate the junction temperature and thermal resistance of the luminous device with an aluminum lead terminal, respectively. Further, lines 'b' designate the junction temperature and thermal resistance of the luminous device with a heat pipe lead terminal, respectively.

The heat pipe lead terminal of this embodiment can be used without any thermal load at a level of electric power about two times greater than that of the aluminum lead terminal. That is, as shown in FIG. 10, the junction temperature of the conventional aluminum lead terminal becomes about 125° C. when an electric power of 0.7 W is applied thereto, but the junction temperature of the present heat pipe lead terminal becomes about 125° C. when an electric power of 1.45 W is applied thereto. It can be seen from the graph that the electric power applicable to the heat pipe lead terminal is at least two times greater than that applicable to the aluminum lead terminal when the heat is generated at the same temperature. On the other hand, the thermal resistance of the heat pipe lead terminal according to this embodiment is about two times lower than that of the aluminum lead terminal. As shown in FIG. 11, the thermal resistance of the conventional aluminum lead terminal is about 150° C./W while the thermal resistance of the heat pipe lead terminal according to this embodiment is about 69° C./W. Thus, the former is about two times higher than the latter.

In this way, the luminous device with the heat pipe lead frame integrally formed with a heat pipe can be driven with lower thermal resistance at a higher level of electric power.

The present invention is not limited thereto and can be applied to a variety of luminous devices. Hereinafter, a surface mount luminous device having an electrode integrally formed with a heat pipe according to a third embodiment of the present invention will be described with reference to the accompanying drawings. The descriptions of the third embodiment that overlaps with those of the first and second embodiments will be omitted herein.

Figure 12:
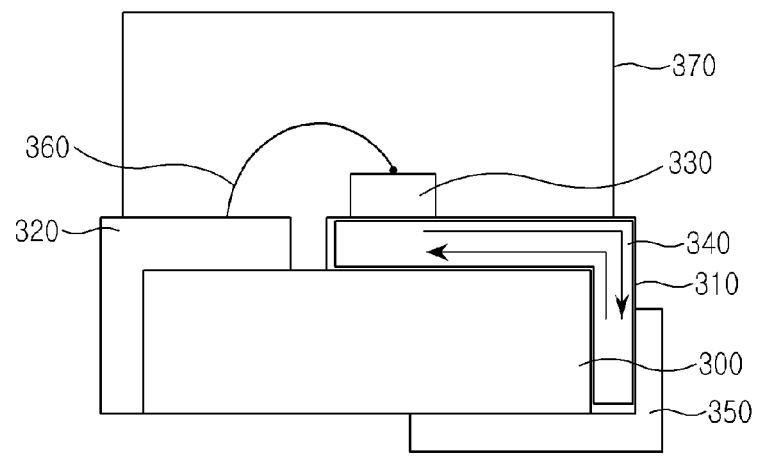
FIG. 12 is a sectional view of a luminous device according to a third embodiment of the present invention.

FIG. 12 is a sectional view of the luminous device according to the third embodiment of the present invention.

Referring to FIG. 12, the luminous device of this embodiment comprises a substrate 300, a heat pipe electrode 310 formed on an upper surface of the substrate 300, an electrode 320 spaced apart from the heat pipe electrode 310 by a certain interval, a luminous chip 330 mounted onto an end of the heat pipe electrode 310, and a wire 360 for connecting the luminous chip 330 and the electrode 320 with each other. Further, the luminous device further comprises an additional molding portion 370 for sealing the luminous chip 330. A phosphor (not shown) that is potted over the luminous chip 330 to emit desired light to the outside may be further provided. In addition, a heat dissipation member 350 connected to the other end of the heat pipe electrode 310 is further provided. Such a heat dissipation member 350 includes a heat radiating plate or thermoelectric device.

In FIG. 12, an inverted 'L' shaped heat pipe electrode 310 has been formed on the upper surface of the substrate. The heat pipe electrode 310 of this embodiment is formed into an inverted 'L' pipe partially filled with a fluid 340. In this embodiment, an internal space of the heat pipe electrode 310 is somewhat exaggerated for the purpose of easy explanation of the present invention. Of course, the internal space of the heat pipe electrode can be manufactured in various shapes depending on the type of electrodes formed on the surface of the substrate. The heat pipe electrode 310 is manufactured in such a manner that the interior of the heat pipe electrode formed with a predetermined internal space is made to be a vacuum state, and the heat pipe electrode is then sealed after the internal space thereof is filled with the fluid 340.

Therefore, the heat pipe electrode 310 functions as an electrode for supplying the luminous device with a predetermined electric current and a cooling means (heat pipe) for cooling heat generated from the luminous device. If it is used as a heat pipe, the one end of the heat pipe electrode 310 where the luminous chip 330 is mounted becomes an evaporating portion while the other end of the heat pipe electrode 310 which is brought into contact with the heat dissipation member 350 becomes a condensing portion. The other portions become a transferring portion.

As shown in FIG. 12, the cooling efficiency can be increased because the heat emitted from the luminous chip 330 is absorbed by and then transferred to the heat dissipation member 350 through the heat pipe electrode 310 positioned below the luminous chip 330.

Furthermore, as a modified example of this embodiment, the heat pipe electrode can be manufactured at the same size as a housing or heat sink. Hereinafter, the modified examples of the present embodiment will be described with reference to the accompanying drawings.

Figure 13:
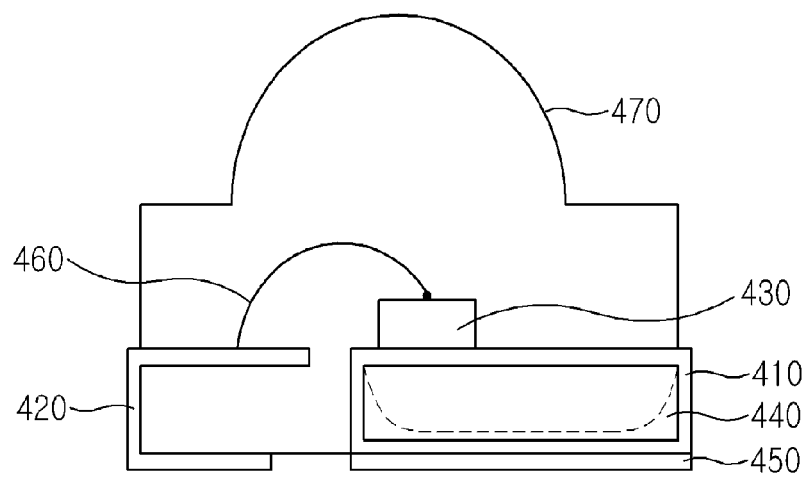
FIGS. 13 and 14 are sectional views of the luminous devices according to modified embodiments of the present invention.
Figure 14:
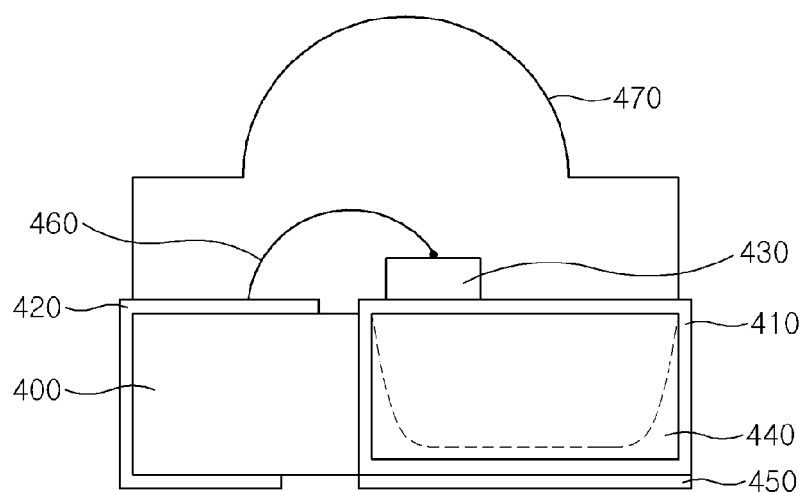

FIGS. 13 and 14 are sectional views of a luminous device according to the modified examples of this embodiment.

Referring to FIG. 13, the luminous device of the modified example of this embodiment comprises a heat pipe electrode 410, a electrode 420 spaced apart from the heat pipe electrode 410 by a certain interval, a luminous chip 430 mounted onto an upper portion of the heat pipe electrode 410, a molding portion 470 for sealing the heat pipe electrode 410, the electrode 420 and the luminous chip 430, and a wire 460 for connecting the luminous chip 430 and the electrode 420. In addition, a heat dissipation member 450 is further provided at a lower portion of the heat pipe electrode 410.

The heat pipe electrode 410 is manufactured into a hollow plate which is sealed after a fluid 440 is injected into the hollow plate. That is, it is formed into a hollow plate, but the external and internal shapes thereof are not limited to the shape of plate. A variety of shapes of the heat pipe electrode can be manufactured according to evaporation and condensation characteristics of the fluid 440. In the meantime, the electrode 420 has a '[' shape and causes a lower electrode portion to be connected to an external power terminal. Then, after the luminous chip 430 is mounted onto the heat pipe electrode 410, the luminous chip 430 is connected to the electrode 420 via the wire 460. Thereafter, the molding process is performed not only to fix the heat pipe electrode 410 and the electrode 420 but also to form the molding portion 470 in which the heat pipe electrode 410, the electrode 420, and the luminous chip 430 are sealed.

Further, referring to FIG. 14, the luminous device comprises a substrate 400, a heat pipe electrode 410 integrally formed with a heat pipe and perforated through the substrate 400, an electrode 420 formed on the substrate 400, a luminous chip 430 mounted onto an upper portion of the heat pipe electrode 410, and a wire 460 for connecting the luminous chip 430 and the electrode 420. In addition, a molding portion 470 for sealing the luminous chip 430 is further provided. Moreover, the luminous device further comprises a heat dissipation member 450 connected to a lower portion of the heat pipe electrode 410.

The heat pipe electrode 410 in the form of a heat pipe is manufactured into a hollow rectangular box which is sealed after a fluid 440 is injected into the hollow rectangular box. Further, the electrode 420 is also formed on the surface of the substrate but is spaced apart from the heat pipe electrode 410 by a certain interval. Then, the luminous chip 430 is mounted onto the heat pipe electrode 410. After the luminous chip 430 and the electrode 420 are connected to each other via the wire 460, the molding process of forming the molding portion is performed to manufacture the luminous device.

According to the aforementioned luminous device of these modified examples shown in FIGS. 13 and 14, heat is absorbed through an evaporation phenomenon at an upper portion of the heat pipe electrode 410 mounted with the luminous chip 430, whereas heat is released at a lower portion of the heat pipe electrode 410 positioned far away from the luminous chip 430 while the evaporated vapor is liquefied. At this time, the released heat is transferred to the outside via the heat dissipation member 450 positioned below the heat pipe electrode 410.

The shape of the heat pipe electrode 410 is not limited to the foregoing and can be implemented in various manners. Hereinafter, the shape of such a heat pipe electrode according to the modified examples of the present embodiment will be explained with reference to the accompanying drawings.

FIGS. 15 to 18 are schematic sectional views illustrating the shapes of heat pipe electrodes according to modified embodiments of the present invention.

Figure 15:
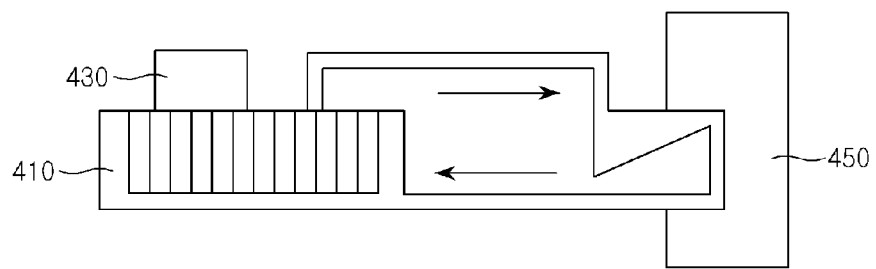
FIGS. 15 to 18 are schematic sectional views illustrating the shapes of heat pipe electrodes according to modified embodiments of the present invention.
Figure 16:
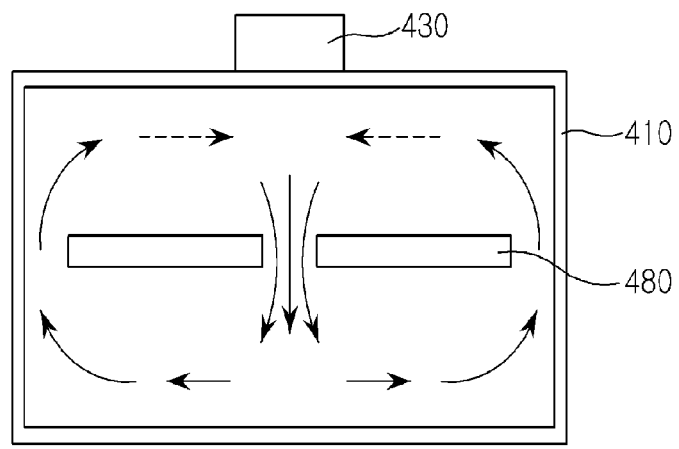
Figure 17:
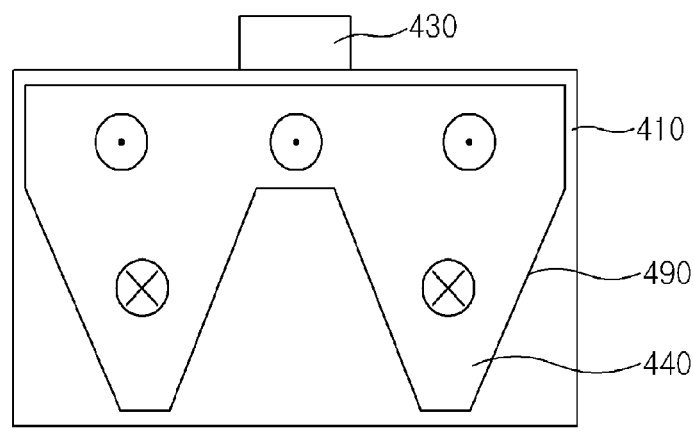
Figure 18:
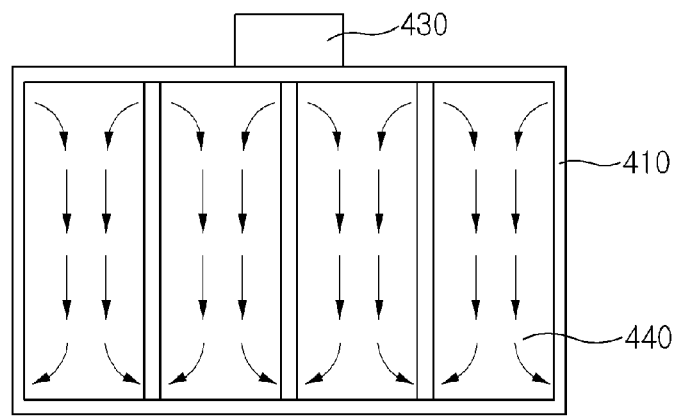

As shown in FIG. 15, a heat pipe electrode 410 according to a modified embodiment of the present invention takes the shape of a loop in which a mount portion on which a luminous chip 430 of the electrode 410 is mounted, a pipe portion through which heat is transferred, and a heat dissipation portion for dissipating heat to the outside are arranged in a horizontal direction. Heat input through the mount portion is dissipated to the outside from a heat dissipation member 450 of the heat dissipation portion by means of latent heat of evaporation of a fluid within the pipe portion connected to the mount portion. This structure is effective for use in the electrode structure of the luminous device shown in FIG. 13. Further, as shown in FIG. 16, separating plates 480 may be formed in an internal space of the heat pipe electrode 410 to partition the internal space. Thus, it is possible to support a side load of the heat pipe electrode 410 as well as to forcibly induce a convection phenomenon between gas and liquid as shown in the figure. In FIG. 16, arrows indicated by dotted lines represent the movement of vapor, and arrows indicated by solid lines represent the movement of the fluid. An evaporation phenomenon occurs at an upper side where the luminous chip 430 is mounted, with respect to the two separating plates 480. Thus, heat is absorbed from the luminous chip 430. The evaporated vapor descends to a region between the separating plates 480, and the descending vapor is condensed at a lower region and emits heat. This structure is effective for use in the electrode structure of the luminous device shown in FIG. 14. Moreover, as shown in FIG. 17, a receiver 490 with a specific shape to store a fluid 440 therein may be formed in the internal space of the heat pipe electrode 410. At this time, evaporated vapor moves in a direction emerging from the plane of the figure at an upper portion of the receiver 490, and the fluid 440 that is in a liquid state within the receiver 490 moves in a direction entering the plane of the figure. Accordingly, it is possible to withstand a load exerted on the electrode and to manufacture the heat pipe electrode 410 into an elongated plate, thereby achieving a wider area resulting in improvement of a heat dissipation effect by which generated heat is absorbed and dissipated to the outside. In addition, as shown in FIG. 18, a plurality of internal spaces may be arranged in the heat pipe electrode 410 and a fluid 440 may be injected into the respective spaces so that each of the internal spaces can serve as a heat pipe. That is, the internal space of the heat pipe electrode 410 may be constructed in the form of a honeycomb as well as a single large barrel. It is apparent that the fluid 440 is injected into the internal space with such a shape so that the internal space can operate as a heat pipe. Moreover, a wick may be formed on an inner surface of the heat pipe electrode 410 to maximize cooling efficiency.

The respective components of each of the aforementioned first to third embodiments are not limited only to application to the corresponding embodiment but can be substituted with those of the other embodiments. Further, in the present invention, at least a portion of the internal spaces of the heat pipe lead frame, lead terminals and electrode may be filled with a fluid. Accordingly, heat emitted from the luminous chip can be dissipated to the outside through the convection phenomenon of the fluid. That is, 10 to 70% of the internal spaces of the lead frame and electrode may be filled with the fluid. Moreover, the shapes of the internal spaces of the lead frame and electrode may be in various shapes including a circle, an ellipse, a triangle, a rectangle and the like. Although an additional heat dissipation member may not be used at a lower portion of the heat pipe, cooling efficiency can be more improved upon use of the additional heat dissipation member.

The heat pipe lead frame, the lead terminal and the electrode can be manufactured by means of various methods. Next, a method of manufacturing a heat pipe lead frame according to the first embodiment of the present invention will be described with reference to the drawings.

Figure 19:
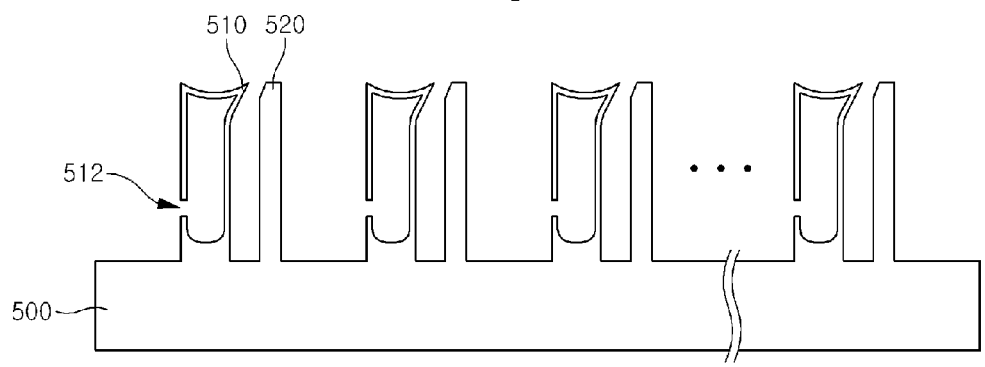
FIGS. 19 and 20 are schematic sectional views illustrating a method of manufacturing a heat pipe lead frame according to an embodiment of the present invention.
Figure 20:
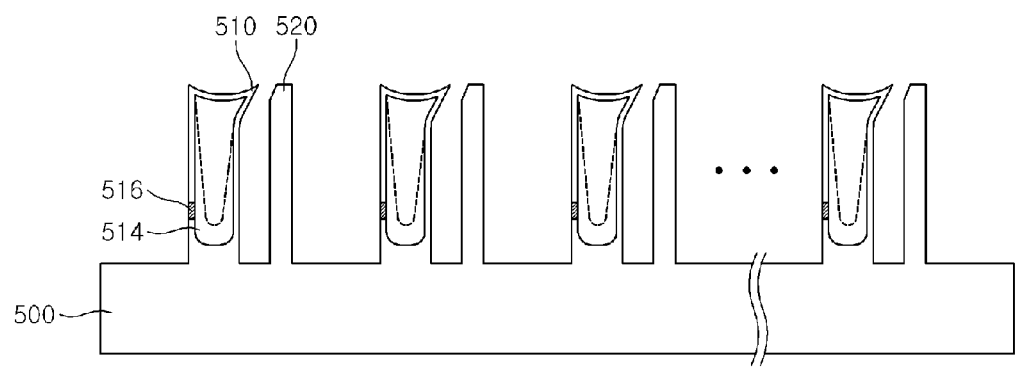

FIGS. 19 and 20 are schematic sectional views illustrating a method of manufacturing a heat pipe lead frame according to an embodiment of the present invention.

Referring to FIG. 19, a plurality of heat pipe lead frames 510 each of which has an internal space and an opening 512 formed at a side thereof, and lead frames 520 that are paired with the heat pipe lead frames 510 are formed on a predetermined support plate 500.

The support plate 500, the heat pipe lead frames 510 and the lead frames 520 will be described in greater detail below.

A hole cup for mounting a luminous chip therein is formed in an upper surface of the heat pipe lead frame 510. Here, the heat pipe lead frames 510 and the lead frames 520 may be formed to have an identical thickness. However, it is also possible to make the thickness of the heat pipe lead frames 510 about six (6) times as large as that of the lead frames 520.

At this time, the support plate 500, the heat pipe lead frames 510 and the lead frame 520 are manufactured integrally with one another. The support plate 500 is made of a material with superior thermal and electrical conductivity including aluminum and copper.

Each of the heat pipe lead frames 510 is formed with the opening 512 at a position on a side thereof opposite to the corresponding lead frame 520. This is to facilitate injection of a fluid that is to be injected through a subsequent process. The opening 512 may be formed in various shapes.

Further, although not shown in the figures, in order to make the internal space of the heat pipe lead frame 510 in a vacuum state and to inject the fluid thereinto, it is preferred that the opening 512 be formed to take the shape of a truncated cone in such a manner that the diameter of the opening at an outer wall of the heat pipe lead frame is larger than that of the opening at an inner wall of the heat pipe lead frame. Further, the opening may be formed to protrude from a sidewall of the heat pipe lead frame 510. In this case, the protruding opening may be clogged by an additional plug to hermetically seal the internal space of the heat pipe lead frame 510.

Referring to FIG. 20, after the heat pipe lead frame 510 having the internal space and the opening 512 communicating therewith is completely cleaned, the internal space of the heat pipe lead frame 510 is made to be in a vacuum state. The fluid 514 is then injected into the internal space of the heat pipe lead frame 510 in the vacuum state. Subsequently, the opening 512 is sealed with a sealing portion 516 to complete the heat pipe lead frame 510. Here, a wick (not shown) may be formed on an inner surface defining the internal space of the heat pipe lead frame 510 by using a mesh-forming method or a metal powder sintering method.

To facilitate the injection of the fluid 514 into the internal space of the heat pipe lead frame 510, air is discharged from the internal space of the heat pipe lead frame 510 through the opening of the heat pipe lead frame 510, thereby achieving the vacuum state. Then, the fluid 514 is injected through the opening that in turn is sealed so that the fluid 514 cannot leak out.

Figure 21:
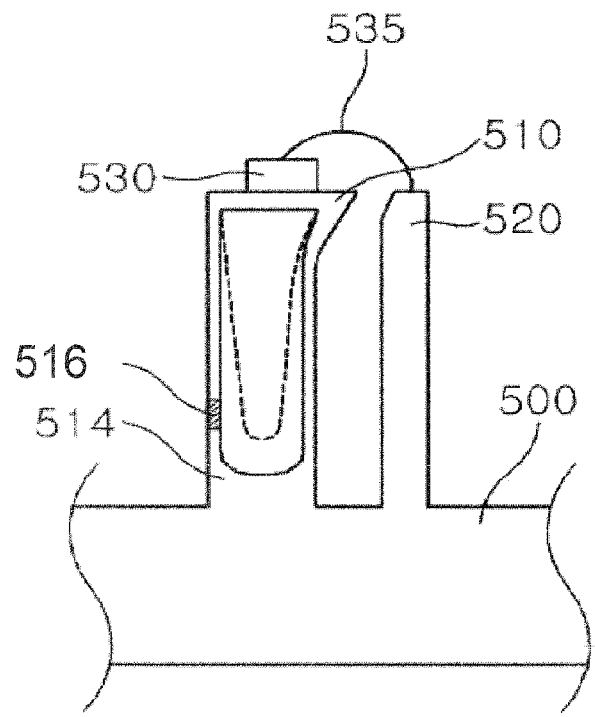
FIGS. 21 to 23 are schematic sectional views illustrating a method of manufacturing a luminous device using a heat pipe lead frame according to the present invention.
Figure 22:
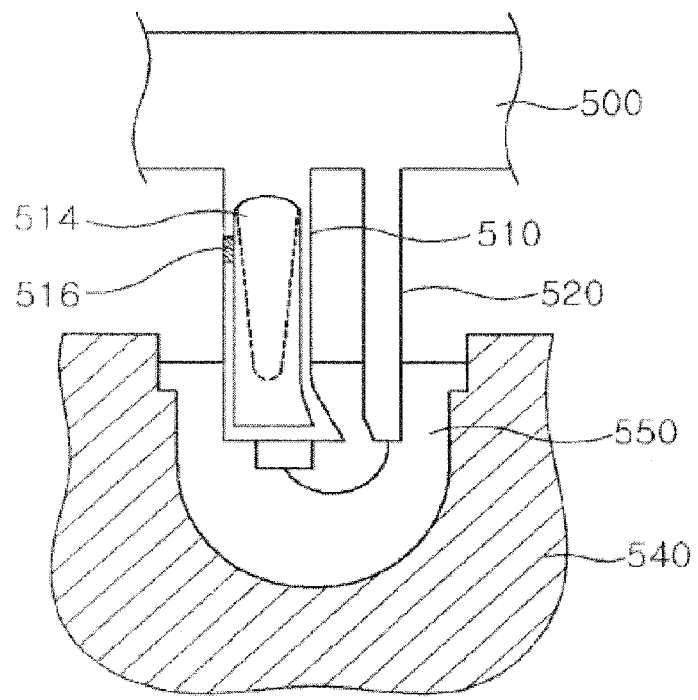
Figure 23:
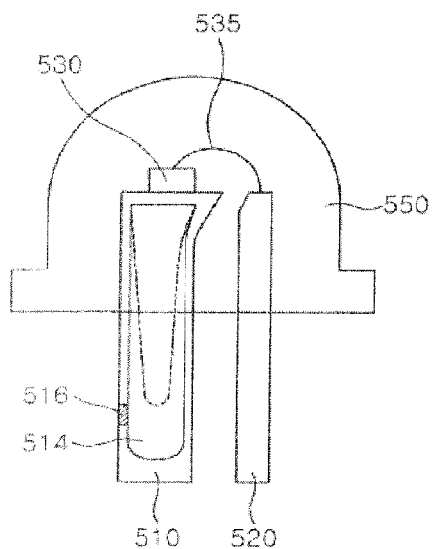

FIGS. 21 to 23 are schematic sectional views illustrating a method of manufacturing a luminous device using a heat pipe lead frame according to the present invention.

Referring to FIG. 21, a luminous chip 530 is mounted on the heat pipe lead frame 510 manufactured by means of the method illustrated in FIGS. 19 and 20. Here, if a pre-determined hole cup for mounting the luminous chip 530 therein is formed at a distal end of the heat pipe lead frame 510, the luminous chip 530 is mounted in the hole cup upon mounting of the luminous chip 530.

Thereafter, the luminous chip 530 mounted on the heat pipe lead frame 510 is connected to the lead frame 520 by a wire 535 through a wiring process.

Referring to FIGS. 22 and 23, the heat pipe lead frame 510 with the luminous chip 530 mounted thereon is placed in a predetermined mold 540 and molding is performed with epoxy to form a molding portion 550. Then, a cutting process is performed to separate the heat pipe lead frame 510 and the lead frame 520 from the support plate 500, thereby manufacturing a luminous device.

Figure 24:
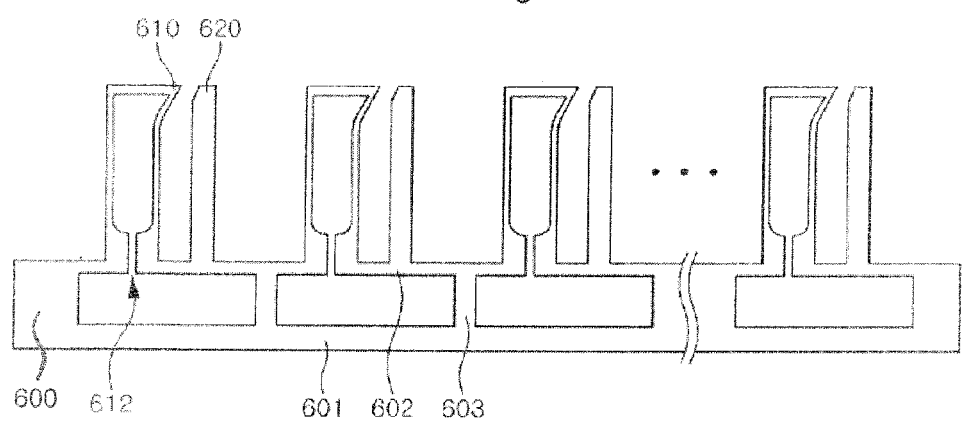
FIGS. 24 and 25 are schematic sectional views illustrating a method of manufacturing a heat pipe lead frame according to another embodiment of the present invention.
Figure 25:
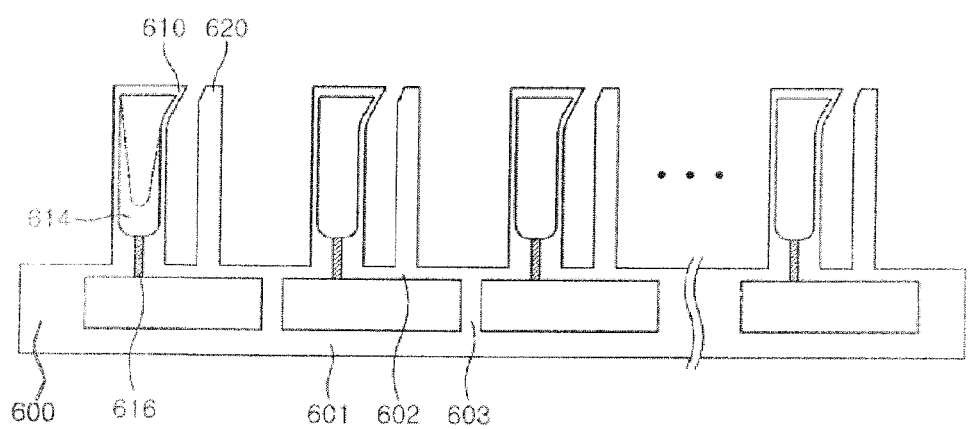

FIGS. 24 and 25 are schematic sectional views illustrating a method of manufacturing a heat pipe lead frame according to another embodiment of the present invention.

Referring to FIG. 24, a support plate 600 is formed to have a lower portion 601, an upper portion 602, and support portions 603 for supporting the lower and upper portions 601 and 602 and thus is formed with cavities defined by the respective portions. A plurality of heat pipe lead frames 610 are formed to protrude from the upper portion 602 of the support plate 600 and to have internal spaces formed therein. Predetermined openings 612 are formed to cause the internal spaces of the heat pipe lead frames 610 to communicate with the cavities of the support plate 600, respectively. Lead frames 620 are formed to be paired with the heat pipe lead frames 610.

Figure 26:
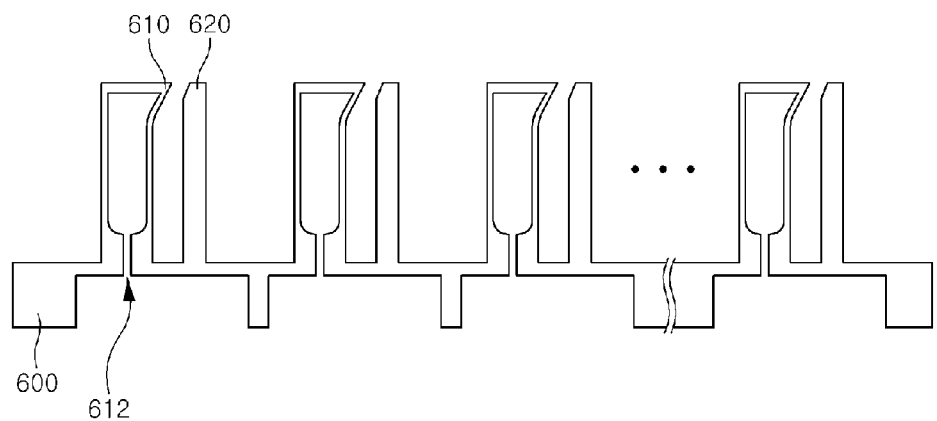
FIG. 26 is a schematic illustrating a lead frame according to a further embodiment of the present invention.

The structure shown in FIG. 24 (in which each of the heat pipe lead frame 610 has the empty space) is formed by cutting a predetermined metal plate or through molding using a predetermined mold. Then, impurities adhering on inner surfaces of the heat pipe lead frames 610, the lead frames 620 and the support plate 600 are removed by performing a cleaning process. Further, the support plate 600 may be formed to have a shape of [ as shown in FIG. 26. In this case, the openings 612 can be easily formed and a fluid can be easily injected through the openings 612.

Referring to FIG. 25, the internal space of each of the heat pipe lead frames 610 is made to be in a vacuum state using the opening 612 that causes the upper portion 602 of the support plate 600 to communicate with the internal space of the heat pipe lead frame 610, and the fluid 614 is injected thereinto. Then, the opening 612 is sealed by a sealing portion 616 so that the fluid 614 cannot leak out. It is apparent that a wick (not shown) may be formed on an inner surface of the heat pipe lead frame 610 using a molding method prior to the achievement of the vacuum state.

By forming the openings 612 at lower regions of the heat pipe lead frames 610 in this embodiment, impurities generated upon manufacture of the heat pipe lead frames 610 and the lead frames 620 can be prevented from adhering to the inner surfaces of the heat pipe lead frames 610. The vacuum state can be easily achieved in the internal spaces of the heat pipe lead frames 610 and the fluid 614 can be easily injected thereinto.

The heat pipe lead frame of the present invention is not limited to those shown in the drawings but may have various shapes. For example, the heat pipe lead frame may have a shape of "[" or "–" The use of the heat pipe lead frame described above rapidly cools heat emitted from the luminous chip, resulting in reduced thermal stress.

Meanwhile, for ease of description of the embodiments illustrated above, the description thereof has been made by limiting a chip to be mounted on the heat pipe lead frame to a bonding chip. However, it is not limited thereto and it will be apparent that a double bonding chip may be mounted thereon.

As described above, according to the present invention, a chip is mounted on a heat pipe to improve the cooling efficiency of a luminous device and to reduce thermal stress imposed on the luminous device.

Further, it is possible to obtain a heat dissipation effect several times as high as that obtained when a heat pipe is formed into a lead frame, a lead terminal or an electrode that in turn is incorporated into a conventional luminous device. Thus, it is possible to reduce thermal stress on a luminous device and to prevent the occurrence of a phenomenon in which external impurities penetrate into the luminous device.

In addition, the cooling efficiency and the light-emitting efficiency of a luminous chip can be maximized by further disposing a heat dissipation member, which has been connected to the heat pipe, outside the luminous device with the heat pipe.

Moreover, a fluid can be easily injected into an internal space of the lead frame through an opening formed in a sidewall or a lower region of the lead frame.

The invention claimed is:

1. A luminous device, comprising:
a substrate having an upper surface, a lower surface, and opposing first and second side surfaces that extend from the upper surface to the lower surface, the first and second side surfaces being disposed at the outer perimeter of the substrate;
a heat pipe electrode disposed directly on the upper surface of the substrate;
an electrode disposed directly on the upper surface of the substrate and spaced apart from the heat pipe electrode;
a luminous chip mounted on the heat pipe electrode;
a wire connecting the luminous chip and the electrode with each other; and
a molding portion sealing the luminous chip.

2. The luminous device as claimed in claim 1, wherein the heat pipe electrode includes at least one internal space, a wick formed on an inner wall defining the internal space, and a fluid located within the internal space.

3. The luminous device as claimed in claim 2, wherein the fluid is selected from a group consisting of methanol, acetone, distilled water, mercury, He, $N_2$, $CHClF_2$, $NH_3$, $CCl_2F_2$, $CClF_2$—$CClF_2$, $CCl_3F$ and $CCl_2F$-$CClF_2$, and 10% to 70% of the internal space is filled with the fluid.

4. The luminous device as claimed in claim 2, wherein a separating plate is further installed in the internal space.

5. The luminous device as claimed in claim 1, wherein:
the heat pipe electrode extends from the upper surface onto the first side surface of the substrate; and
the electrode extends from the upper surface onto the second side surface of the substrate.

6. The luminous device as claimed in claim 1, wherein the heat pipe electrode is formed to perforate through the substrate.

7. The luminous device as claimed in claim 1, further comprising a heat dissipation member connected to the heat pipe electrode.

8. The luminous device as claimed in claim 5, wherein the electrode extends from the second side surface onto the lower surface of the substrate.

9. A luminous device, comprising:
a substrate having an upper surface, a lower surface, and opposing first and second side surfaces that extend from the upper surface to the lower surface, the first and second side surfaces being disposed at the outer perimeter of the substrate;
a heat pipe electrode disposed directly on the first side surface of the substrate;
an electrode disposed directly on the upper surface of the substrate and spaced apart from the heat pipe electrode;
a luminous chip disposed on the heat pipe electrode;
a wire connecting the luminous chip and the electrode; and
a molding portion sealing the luminous chip.

10. The luminous device as claimed in claim 9, wherein the heat pipe electrode comprises:
at least one internal space;
a wick formed on an inner wall of the internal space; and
a fluid disposed within the internal space.

11. The luminous device as claimed in claim 9, wherein:
the fluid is selected from a group consisting of methanol, acetone, distilled water, mercury, He, $N_2$, $CHClF_2$, $NH_3$, $CCl_2F_2$, $CClF_2$—$CClF_2$, $CCl_3F$, and $CCl_2F$-$CClF_2$; and 10% to 70% of the internal space is filled with the fluid.

12. The luminous device as claimed in claim 10, further comprising a separating plate disposed in the internal space.

13. The luminous device as claimed in claim 9, wherein the electrode extends from the upper surface onto the second side surface of the substrate.

14. The luminous device as claimed in claim 13, wherein the electrode extends from the second side surface onto the lower surface of the substrate.

15. The luminous device as claimed in claim 9, further comprising a heat dissipation member connected to the heat pipe electrode.

* * * * *